(12) United States Patent
Kotani

(10) Patent No.: US 7,821,072 B2
(45) Date of Patent: Oct. 26, 2010

(54) SEMICONDUCTOR DEVICE COMPRISING A STRESS APPLYING INSULATING FILM

(75) Inventor: Naoki Kotani, Hyogo (JP)

(73) Assignee: Panasonic Corporation, Osaka (JP)

( * ) Notice: Subject to any disclaimer, the term of this patent is extended or adjusted under 35 U.S.C. 154(b) by 795 days.

(21) Appl. No.: 11/491,231

(22) Filed: Jul. 24, 2006

(65) Prior Publication Data

US 2007/0040199 A1    Feb. 22, 2007

(30) Foreign Application Priority Data

Aug. 22, 2005   (JP) .............................. 2005-240085

(51) Int. Cl.
    *H01L 21/70* (2006.01)

(52) U.S. Cl. .................. 257/369; 257/637; 257/274; 257/E21.487; 257/E27.06; 257/E21.64

(58) Field of Classification Search ................ 257/369, 257/274, 637, E21.487, E27.06, E21.64
    See application file for complete search history.

(56) References Cited

U.S. PATENT DOCUMENTS

| | | | |
|---|---|---|---|
| 2003/0181005 A1* | 9/2003 | Hachimine et al. | 438/231 |
| 2005/0093078 A1* | 5/2005 | Chan et al. | 257/374 |
| 2006/0113568 A1* | 6/2006 | Chan et al. | 257/204 |
| 2006/0226490 A1* | 10/2006 | Burnett et al. | 257/365 |

FOREIGN PATENT DOCUMENTS

JP    2003-273240    9/2003

OTHER PUBLICATIONS

Chinese Office Action, w/ English translation thereof, issued in Chinese Patent Application No. CN 200610110149.0 dated Mar. 13, 2009.

* cited by examiner

*Primary Examiner*—Kenneth A Parker
*Assistant Examiner*—David Z Chen
(74) *Attorney, Agent, or Firm*—McDermott Will & Emery LLP

(57) ABSTRACT

In a semiconductor device, a transistor in an N-type logic region NL is covered with a tensile stress applying film and a transistor in a P-type logic region PL is covered with a compressive stress applying film. Transistors in a P-type SRAM region PS and an N-type SRAM region NS are covered with a layered film including a tensile stress applying film and a compressive stress applying film.

12 Claims, 14 Drawing Sheets

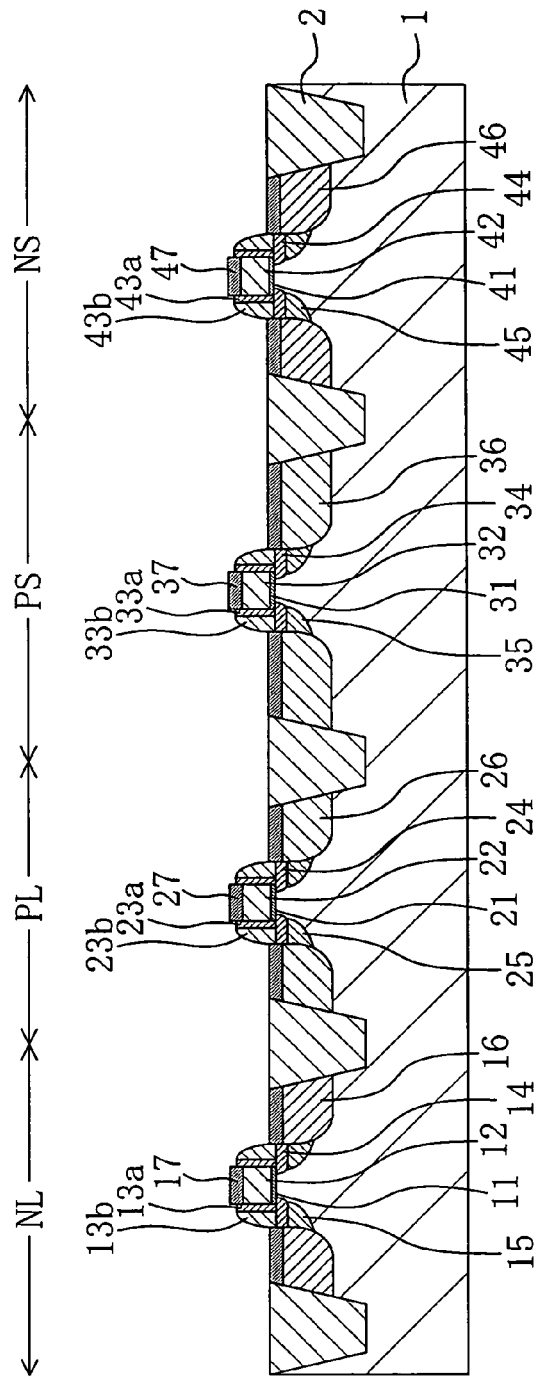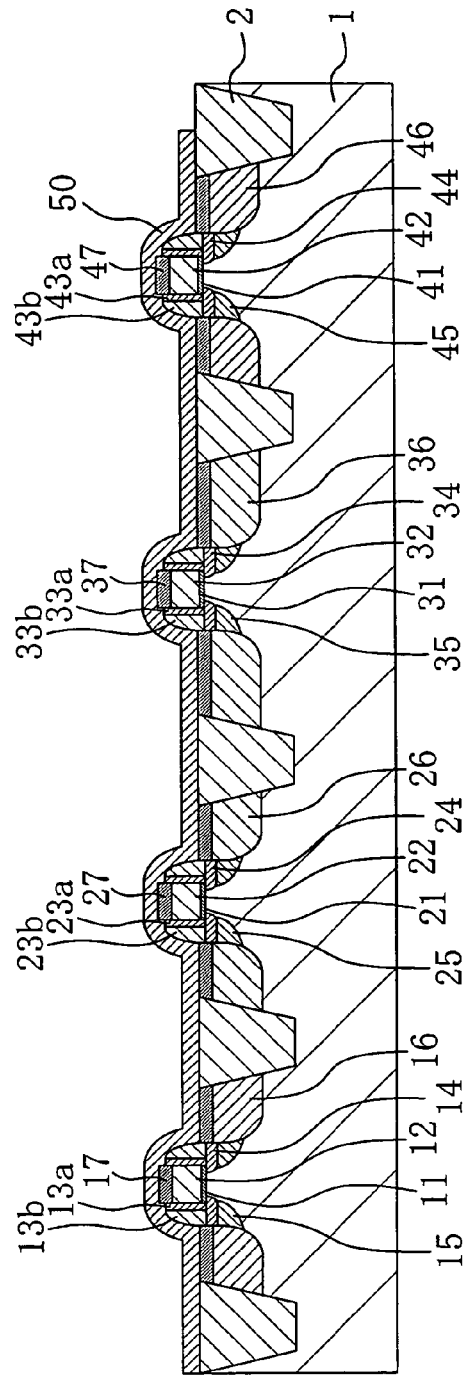
FIG. 2A
FIG. 2B

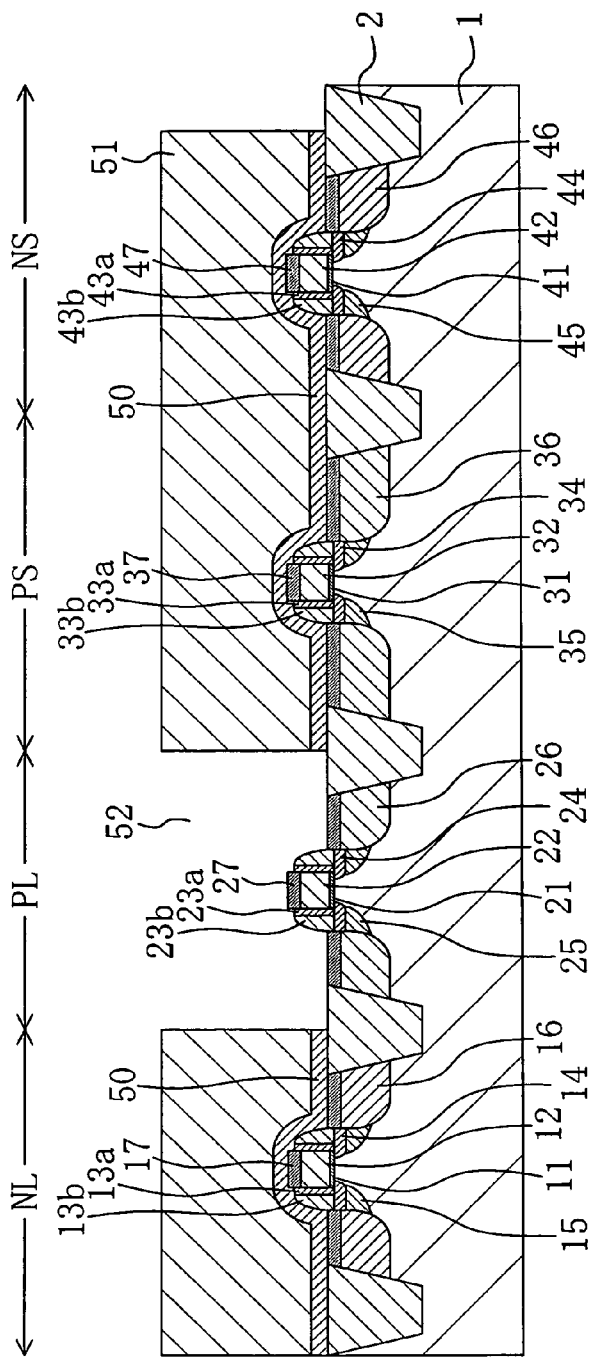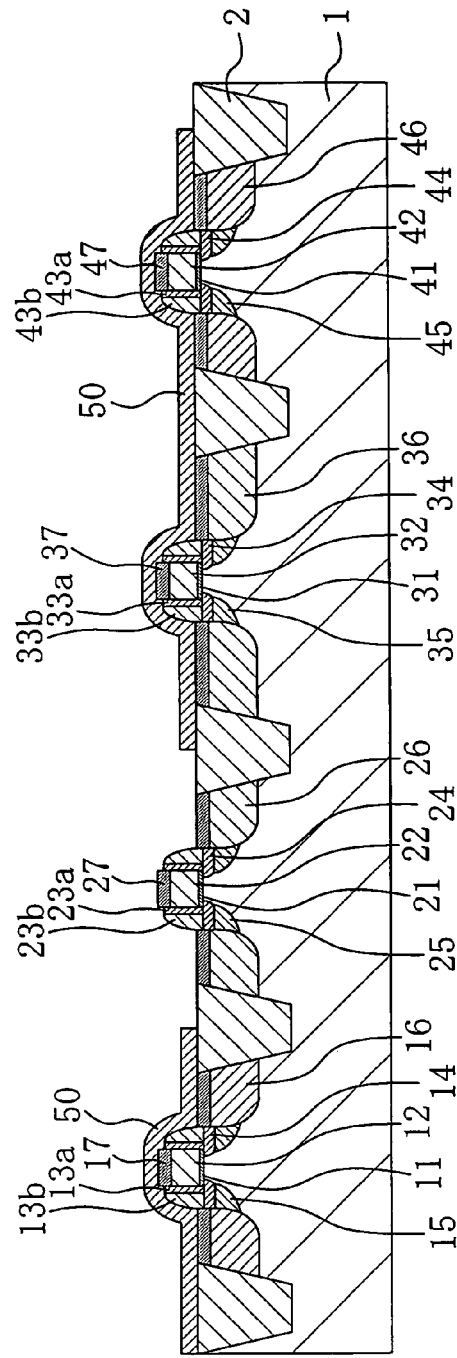
FIG. 3A
FIG. 3B

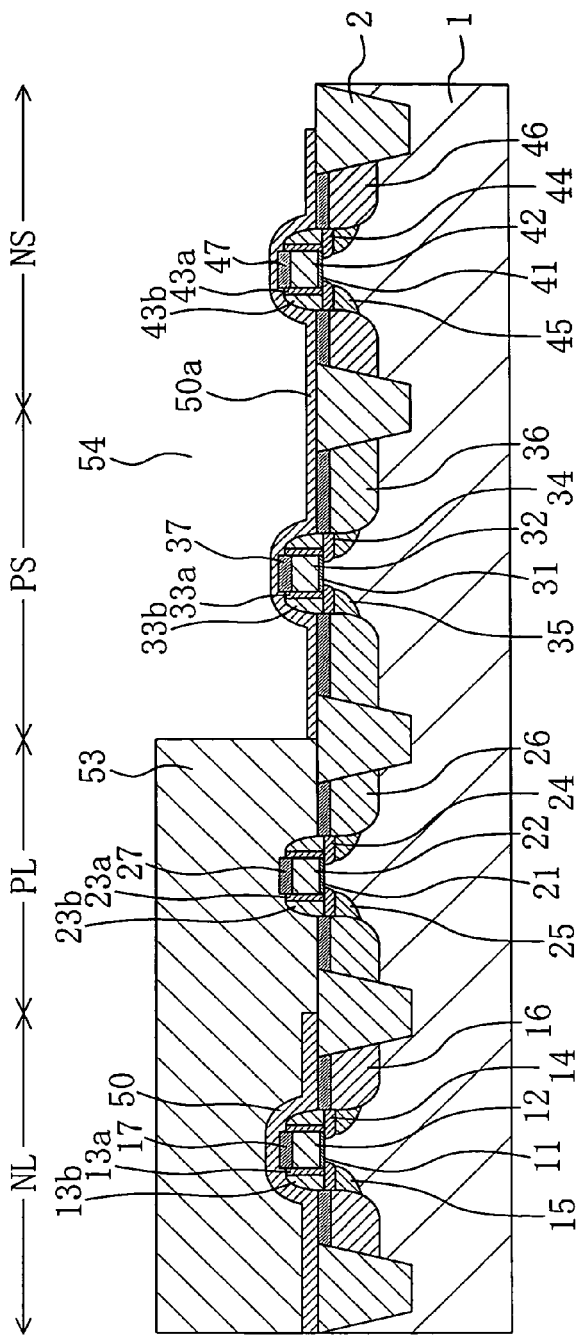
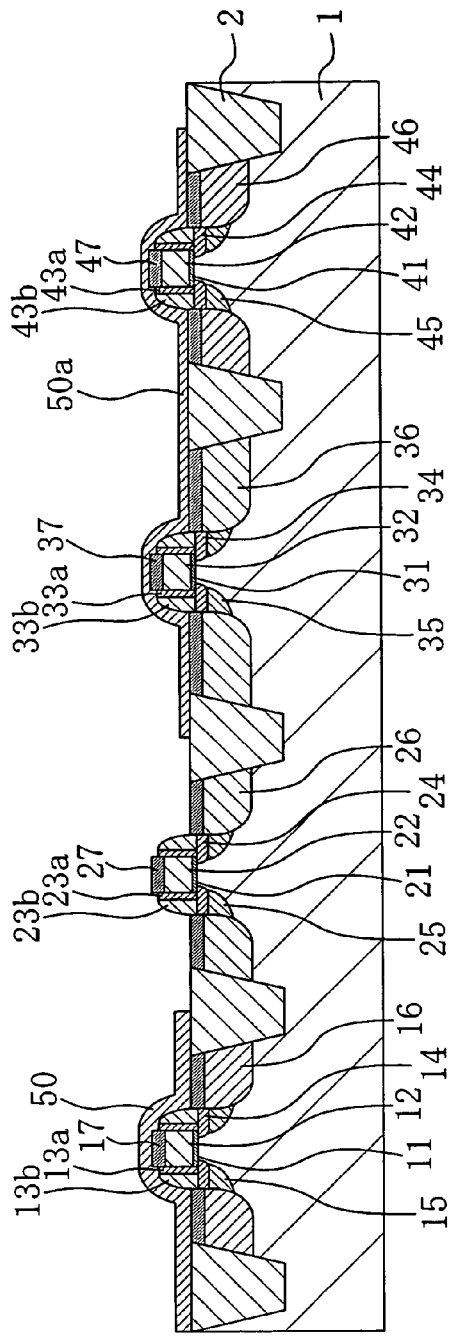
FIG. 4A
FIG. 4B

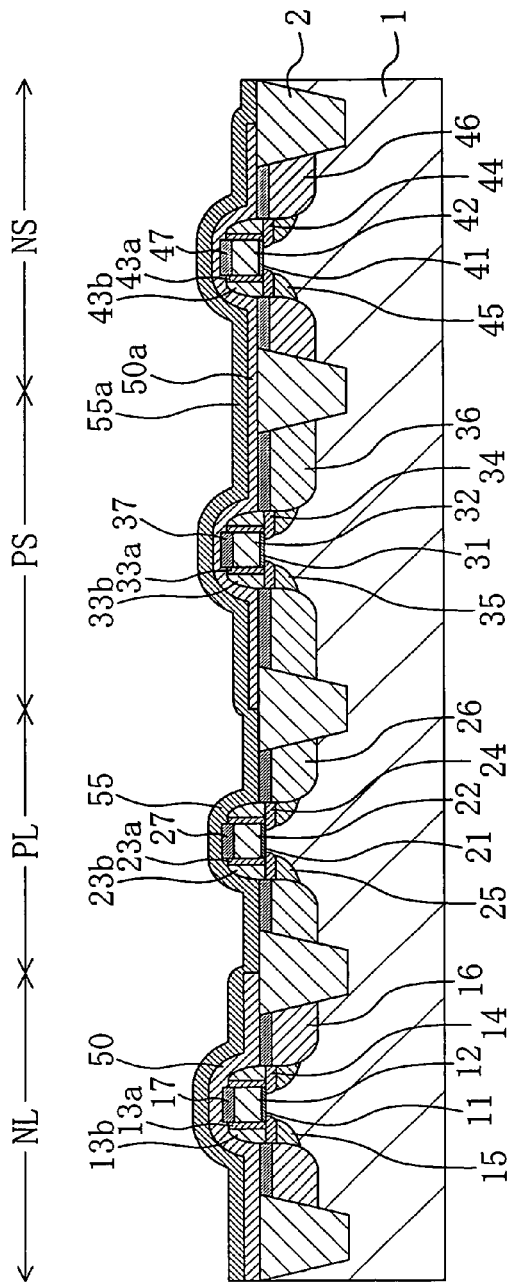
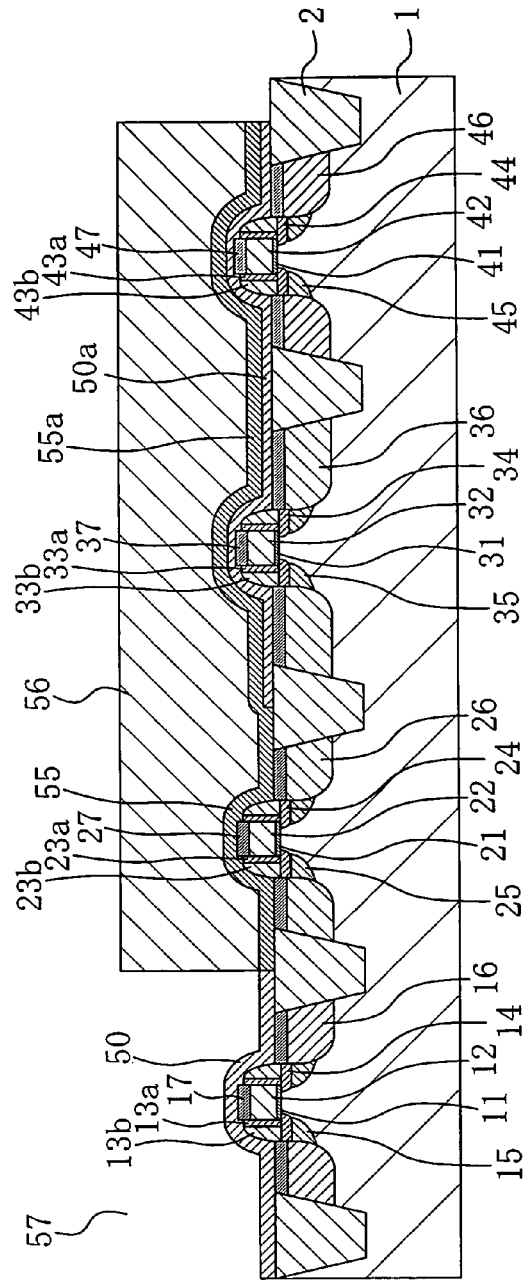
FIG. 5A
FIG. 5B

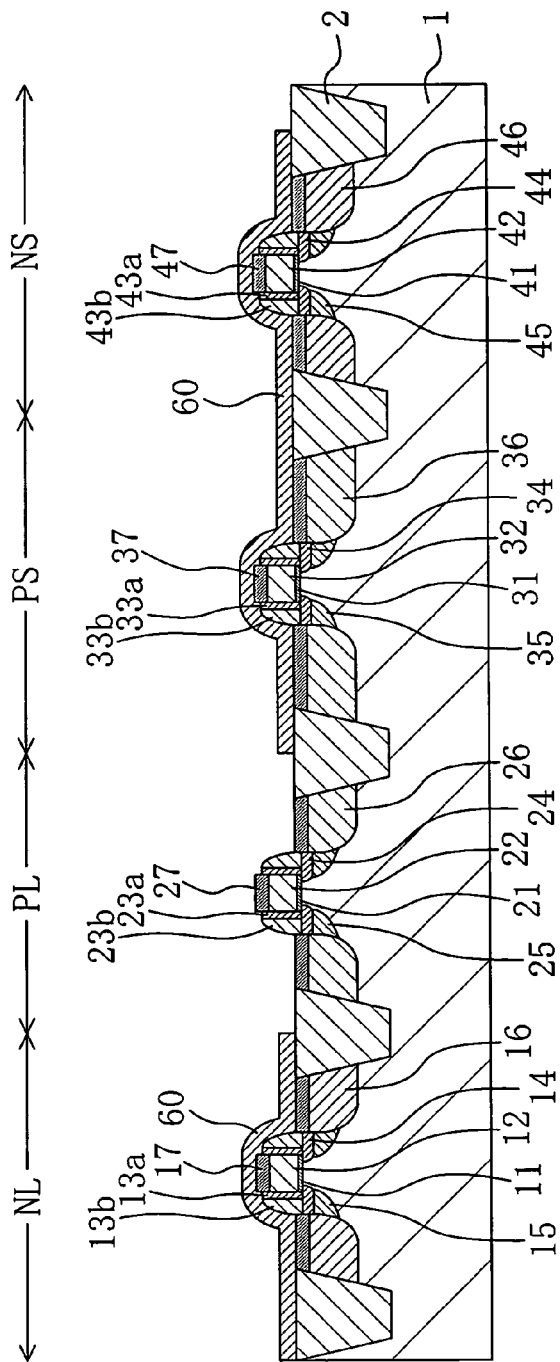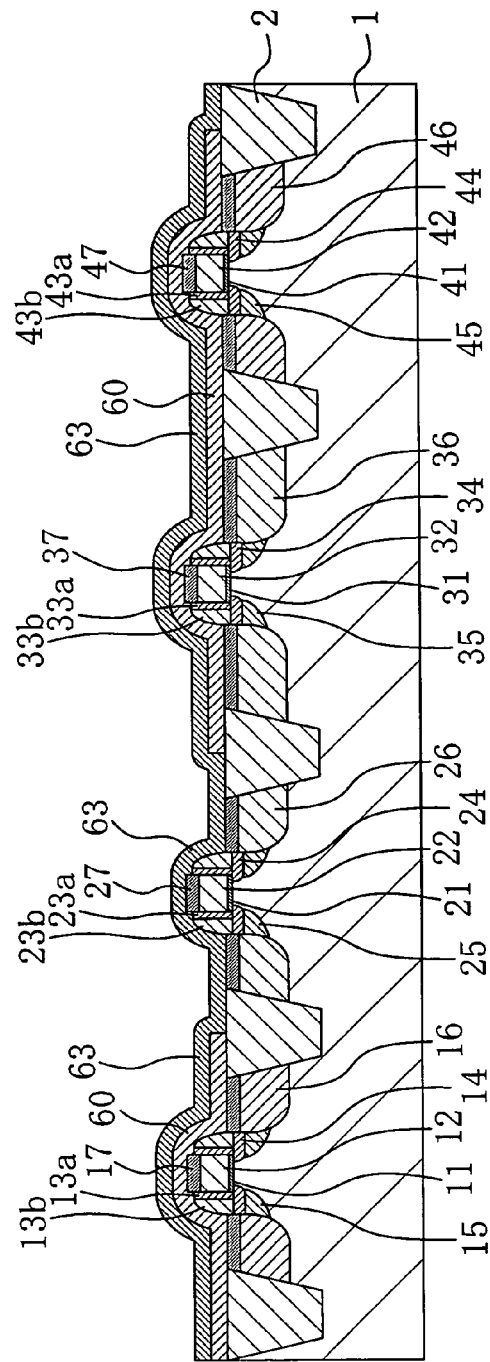

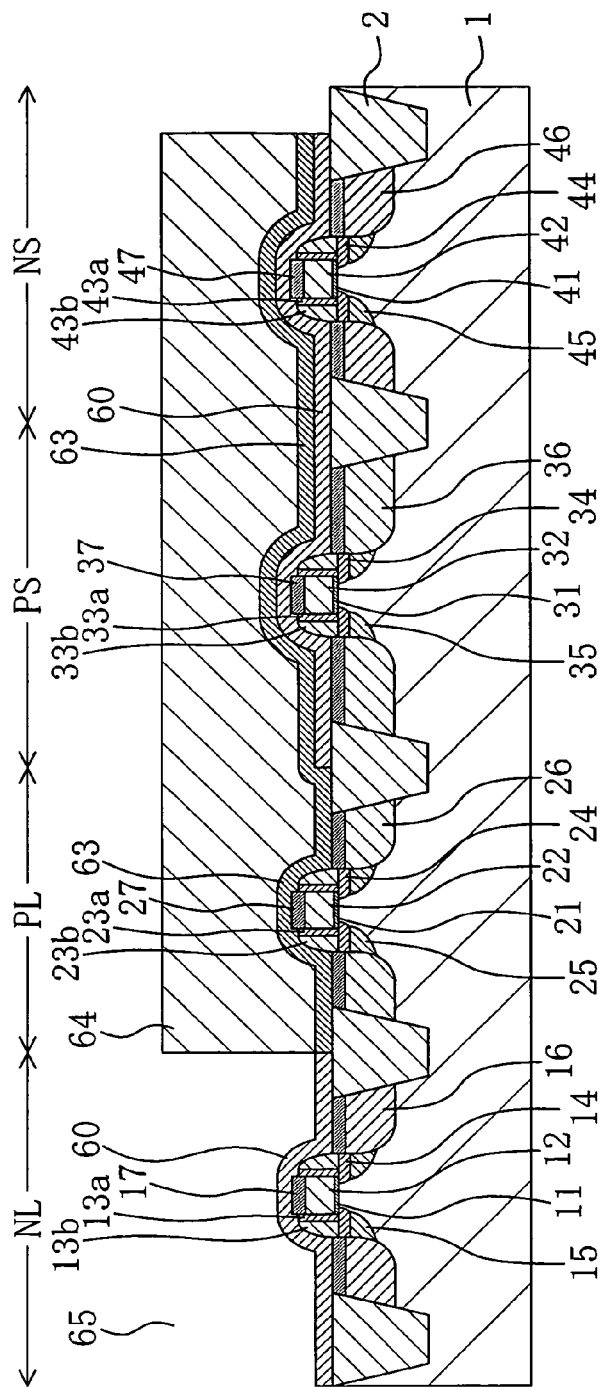
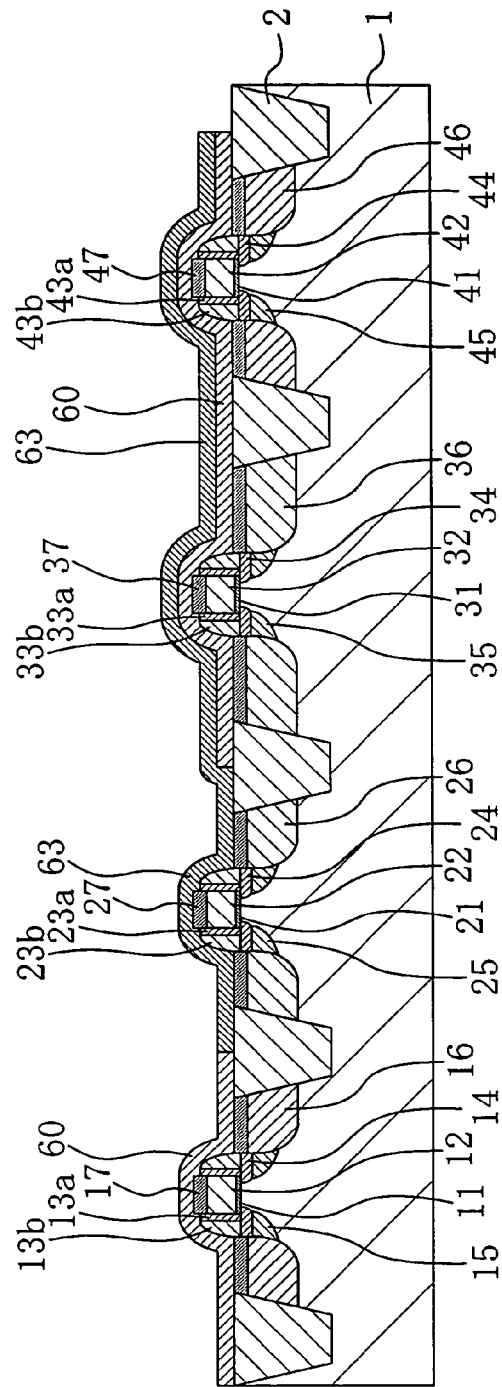
FIG. 11A
FIG. 11B

SEMICONDUCTOR DEVICE COMPRISING A STRESS APPLYING INSULATING FILM

BACKGROUND OF THE INVENTION

In the field of semiconductor devices, processing speed has been increasing and power consumption has been decreasing due to a rapid shift to finer design rules. Accordingly, the need for improvement in transistor performance becomes imperative. However, improvement in performance only by the fine design rules will soon hit a ceiling. In this respect, various novel techniques, such as a technique of applying stress to the transistors, have been developed for the improvement in performance.

For example, as shown in FIG. 13, Japanese Unexamined Patent Publication No. 2003-273240 proposes a method for improving the performance of the transistors by covering N-channel MIS transistors 101 with an LP-CVD (Low Pressure Chemical Vapor Deposition) film 103 which applies tensile stress and covering P-channel MIS transistors 102 with a plasma CVD film 104 which applies compressive stress.

However, the above-described method may cause the following problems.

In an SRAM region, the N-channel MIS transistors and the P-channel MIS transistors are densely arranged. Therefore, it is difficult to cover these transistors with different films applying stresses in different directions. If the N-channel and P-channel MIS transistors are covered with a stress applying film of a single kind, the performance of the N-channel MIS transistors and that of the P-channel MIS transistors may greatly vary.

It may be possible to cover the N-channel MIS transistors and the P-channel MIS transistors with different films applying stresses in different directions. However, when a stress applying insulating film is formed on the entire region and part of it located above any ones of the MIS transistors is removed, parts of sidewalls formed on the side surfaces of the gate electrode are etched away. As a result, when a shared contact covering from the gate electrode to the source/drain region is formed, short circuit may possibly occur between them.

SUMMARY OF THE INVENTION

In light of the above, an object of the present invention is to provide a semiconductor device in which the performances of the N-channel transistors and the P-channel transistors are kept in balance with use of a stress applying insulating film and a method for manufacturing the semiconductor device.

Another object of the present invention is to improve the performances of the N-channel MIS transistors and the P-channel MIS transistors in a logic region and keep the performances of the N-channel and P-channel MIS transistors in the SRAM region in balance while leakage current is prevented from occurring when a shared contact is formed.

According to an embodiment of the present invention, a semiconductor device includes: a first MIS transistor of N-channel type including a first gate electrode which is formed above a first active region made of a semiconductor layer and first source/drain regions which are formed in parts of the first active region located at the sides of the first gate electrode; a second MIS transistor of P-channel type including a second gate electrode which is formed above a second active region made of the semiconductor layer and second source/drain regions which are formed in parts of the second active region located at the sides of the second gate electrode; a layered film which covers the first gate electrode, the first active region, the second gate electrode and the second active region and includes a first insulating film which applies tensile stress and a second insulating film which applies compressive stress; and an interlayer insulating film which is formed on the layered film.

In the semiconductor device of the embodiment of the present invention, the performances of the first and second MIS transistors become almost equal due to the layered film covering the first and second MIS transistors. Therefore, even when the first and second MIS transistors are densely arranged so that they cannot easily be covered with different films, the performances of the first and second MIS transistors are kept in balance. Further, as the first insulating film is warped by tensile stress and the second insulating film is warped by compressive stress, stresses applied to the first and second MIS transistors are alleviated in a balanced manner.

According to an embodiment of the present invention, the first MIS transistor and the second MIS transistor may constitute an SRAM.

According to an embodiment of the present invention, the semiconductor device may further include: a third MIS transistor of N-channel type including a third gate electrode which is formed above a third active region made of the semiconductor layer and third source/drain regions which are formed in parts of the third active region located at the sides of the third gate electrode; and a third insulating film which covers the third gate electrode and the third active region and applies tensile stress, wherein the second insulating film may not be formed above the third active region.

According to an embodiment of the present invention, the first insulating film may be thinner than the third insulating film.

According to an embodiment of the present invention, the third MIS transistor may be formed in a logic region.

According to an embodiment of the present invention, first sidewalls may be formed on the side surfaces of the first gate electrode, the layered film may cover the first source/drain regions, the first sidewalls and the first gate electrode and a first shared contact may be formed to penetrate the interlayer insulating film and the layered film to reach the first source/drain regions, the first sidewalls and the first gate electrode.

According to an embodiment of the present invention, the semiconductor device may further include: a fourth MIS transistor of P-type channel including a fourth gate electrode which is formed above a fourth active region made of the semiconductor layer and fourth source/drain regions which are formed in parts of the fourth active region located at the sides of the fourth gate electrode; and a fourth insulating film which covers the fourth gate electrode and the fourth active region and applies compressive stress, wherein the first insulating film may not be formed above the fourth active region.

According to an embodiment of the present invention, the second insulating film may be thinner than the fourth insulating film.

According to an embodiment of the present invention, the fourth MIS transistor may be formed in a logic region.

According to an embodiment of the present invention, second sidewalls may be formed on the side surfaces of the second gate electrode, the layered film may cover the second source/drain regions, the second sidewalls and the second gate electrode and a second shared contact may be formed to penetrate the interlayer insulating film and the layered film to reach the second source/drain regions, the second sidewalls and the second gate electrode.

Further, an embodiment of the present invention provides a method for manufacturing a semiconductor device including a first MIS transistor of N-channel type including a first gate electrode which is formed above a first active region made of a semiconductor layer and first source/drain regions which are formed in parts of the first active region located at the sides of the first gate electrode and a second MIS transistor of P-channel type including a second gate electrode which is formed above a second active region made of the semiconductor layer and second source/drain regions which are formed in parts of the second active region located at the sides of the second gate electrode, the method comprising the steps of: (a) forming a layered film which covers the first gate electrode, the first active region, the second gate electrode and the second active region and includes a first insulating film which applies tensile stress and a second insulating film which applies compressive stress; and (b) forming an interlayer insulating film on the layered film.

In the method of the embodiment of the present invention, the performances of the first and second MIS transistors become almost equal by covering the first and second MIS transistors with the first and second insulating films. Therefore, even when the first and second MIS transistors are densely arranged so that they cannot easily be covered with different films, the performances of the first and second MIS transistors are kept in balance. Further, as the first insulating film is warped by tensile stress and the second insulating film is warped by compressive stress, stresses applied to the first and second MIS transistors are alleviated in a balanced manner.

According to an embodiment of the present invention, the second insulating film may be formed on the first insulating film to form the layered film in the step (a).

According to an embodiment of the present invention, the first insulating film may be formed on the second insulating film to form the layered film in the step (a).

According to an embodiment of the present invention, the semiconductor device may further include a third MIS transistor of N-channel type including a third gate electrode which is formed above a third active region made of the semiconductor layer and third source/drain regions which are formed in parts of the third active region located at the sides of the third gate electrode, a third insulating film which applies tensile stress and is made of the same film as the first insulating film may be formed in the step (a) to cover the third gate electrode and the third active region, and the interlayer insulating film may be formed on the third insulating film in the step (b) while the second insulating film is not formed above the third active region before the interlayer insulating film is formed.

According to an embodiment of the present invention, the step (a) may include the step of making the first insulating film thinner than the third insulating film.

According to an embodiment of the present invention, the semiconductor device may further include a fourth MIS transistor of P-channel type including a fourth gate electrode which is formed above a fourth active region made of the semiconductor layer and fourth source/drain regions which are formed in parts of the fourth active region located at the sides of the fourth gate electrode, wherein a fourth insulating film which applies compressive stress and is made of the same film as the second insulating film may be formed in the step (a) to cover the fourth gate electrode and the fourth active region, and the interlayer insulating film may be formed on the fourth insulating film in the step (b) while the first insulating film is not formed above the fourth active region before the interlayer insulating film is formed.

According to an embodiment of the present invention, the step (a) may include the step of making the second insulating film thinner than the fourth insulating film.

According to an embodiment of the present invention, the first MIS transistor and the second MIS transistor may constitute an SRAM.

According to an embodiment of the present invention, the method may further include the steps of: (c) forming first sidewalls on the side surfaces of the first gate electrode before the step (a); and (d) forming a first shared contact which penetrates the interlayer insulating film and the layered film to reach the first gate electrode, the first sidewalls and the first active region of the first MIS transistor after the step (b).

According to an embodiment of the present invention, the method may further include the steps of: (c) forming second sidewalls on the side surfaces of the second gate electrode before the step (a); and (d) forming a second shared contact which penetrates the interlayer insulating film and the layered film to reach the second gate electrode, the second sidewalls and the second active region of the second MIS transistor after the step (b).

BRIEF DESCRIPTION OF THE DRAWINGS

FIGS. 2A and 2B are sectional views illustrating the steps of manufacturing the semiconductor device of the first embodiment.

FIGS. 3A and 3B are sectional views illustrating the steps of manufacturing the semiconductor device of the first embodiment.

FIGS. 4A and 4B are sectional views illustrating the steps of manufacturing the semiconductor device of the first embodiment.

FIGS. 5A and 5B are sectional views illustrating the steps of manufacturing the semiconductor device of the first embodiment.

FIGS. 10A and 10B are sectional views illustrating the steps of manufacturing the semiconductor device of the second embodiment.

FIGS. 11A and 11B are sectional views illustrating the steps of manufacturing the semiconductor device of the second embodiment.

DETAILED DESCRIPTION OF THE INVENTION

Hereinafter, a semiconductor device and a method for manufacturing the same according to the present invention will be explained with reference to the drawings.

First Embodiment

Figure 1:
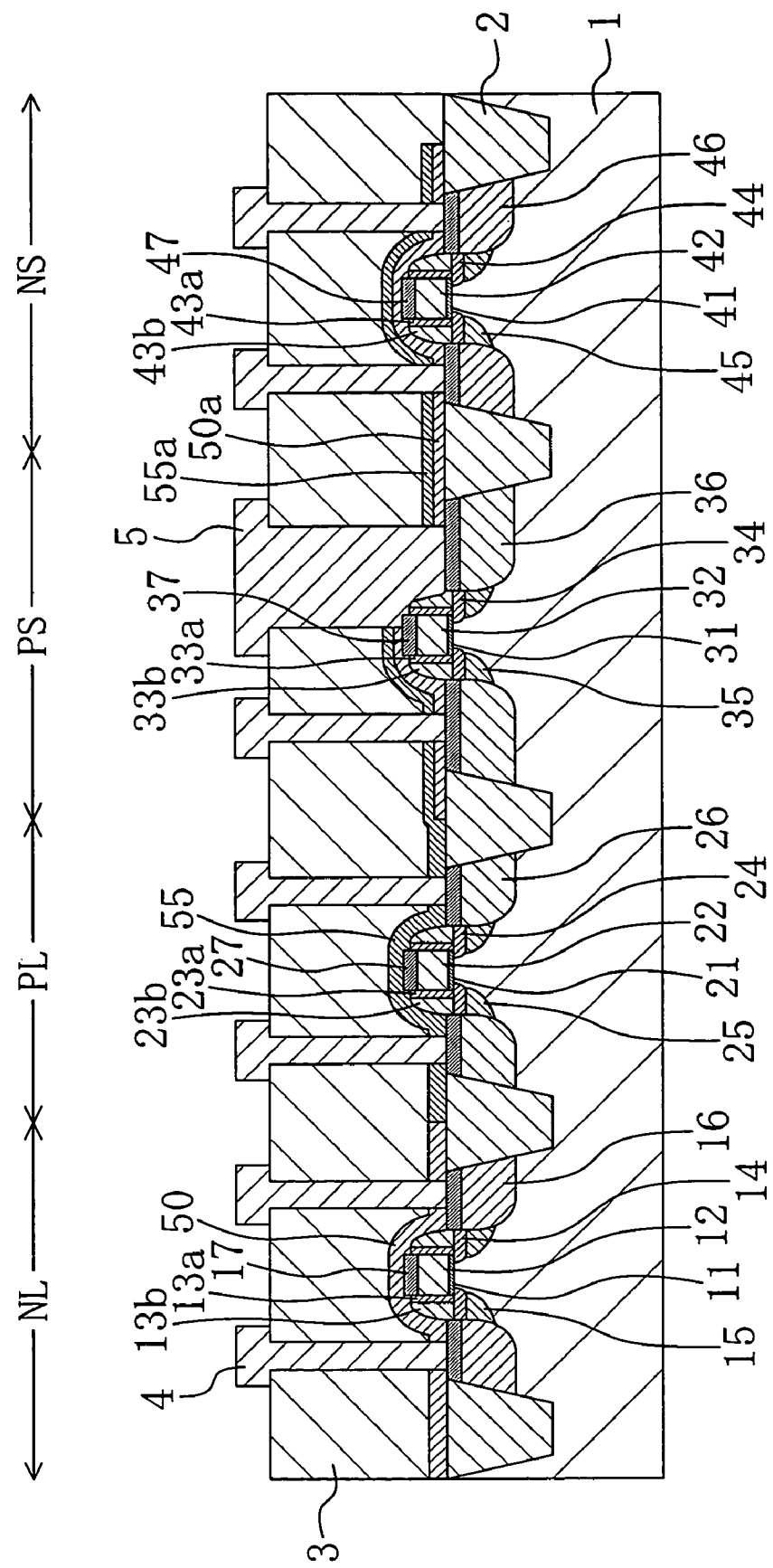
FIG. 1 is a sectional view illustrating the structure of a semiconductor device according to a first embodiment of the present invention.

FIG. 1 is a sectional view illustrating the structure of a semiconductor device according to the first embodiment of the present invention. As shown in FIG. 1, the semiconductor device of the present embodiment includes an N-type logic region NL for providing a logic MIS transistor of N-channel type, a P-type logic region PL for providing a logic MIS transistor of P-channel type, a P-type SRAM region PS for providing an SRAM MIS transistor of P-channel type and an N-type SRAM region NS for providing an SRAM MIS transistor of N-channel type. The regions NL, PL, PS and NS are electrically isolated from each other by a shallow trench isolation region 2.

In the N-type logic region NL, a gate electrode 12 is formed on a semiconductor substrate 1 with a gate insulating film 11 sandwiched therebetween. On the side surfaces of the gate electrode 12, offset sidewalls 13a are formed and sidewalls 13b are formed outside the offset sidewalls 13a. N-type extension regions 14 are formed in parts of the semiconductor substrate 1 below the offset sidewalls 13a and the sidewalls 13 and P-type pocket regions 15 are formed below the N-type extension regions 14. Further, N-type source/drain regions 16 are formed in parts of the semiconductor substrate 1 outside the sidewalls 13b. A silicide layer 17 is formed on the gate electrode 12 and the N-type source/drain regions 16.

In the N-type logic region NL, a tensile stress applying insulating film 50 which is made of a silicon nitride film and applies tensile stress is formed by LP-CVD to cover the gate electrode 12, offset sidewalls 13a, sidewalls 13b and N-type source/drain regions 16. The tensile stress mentioned in the present embodiment indicates stress applied along the gate length direction of a channel region below the gate electrode.

In the P-type logic region PL, a gate electrode 22 is formed on the semiconductor substrate 1 with a gate insulating film 21 sandwiched therebetween. On the side surfaces of the gate electrode 22, offset sidewalls 23a are formed and sidewalls 23b are formed outside the offset sidewalls 23a. P-type extension regions 24 are formed in parts of the semiconductor substrate 1 below the offset sidewalls 23a and the sidewalls 23b and N-type pocket regions 25 are formed below the P-type extension regions 24. Further, P-type source/drain regions 26 are formed in parts of the semiconductor substrate 1 outside the sidewalls 23b. A silicide layer 27 is formed on the gate electrode 22 and the P-type source/drain regions 26.

In the P-type logic region PL, a compressive stress applying insulating film 55 which is made of a silicon nitride film and applies compressive stress is formed by plasma CVD to cover the gate electrode 22, offset sidewalls 23a, sidewalls 23b and P-type source/drain regions 26. The compressive stress mentioned in the present embodiment indicates stress applied along the gate length direction of a channel region below the gate electrode.

In the P-type SRAM region PS, a gate electrode 32 is formed on the semiconductor substrate 1 with a gate insulating film 31 sandwiched therebetween. On the side surfaces of the gate electrode 32, offset sidewalls 33a are formed and sidewalls 33b are formed outside the offset sidewalls 33a. P-type extension regions 34 are formed in parts of the semiconductor substrate 1 below the offset sidewalls 33a and the sidewalls 33b and N-type pocket regions 35 are formed below the P-type extension regions 34. Further, P-type source/drain regions 36 are formed in parts of the semiconductor substrate 1 outside the sidewalls 33b. A silicide layer 37 is formed on the gate electrode 32 and the P-type source/drain regions 36.

In the P-type SRAM region PS, a thin tensile stress applying insulating film 50a which is made of a silicon nitride film which applies tensile stress is formed by LP-CVD to cover the gate electrode 32, offset sidewalls 33a, sidewalls 33b and P-type source/drain regions 36. Further, a thin compressive stress applying insulating film 55a which is made of a silicon nitride film and applies compressive stress is formed by plasma CVD on the thin tensile stress applying insulating film 50a. The thin tensile stress applying insulating film 50a is thinner than the tensile stress applying insulating film 50 in the N-type logic region NL. The thin compressive stress applying insulating film 55a is thinner than the compressive stress applying insulating film 55 in the P-type logic region PL.

In the N-type SRAM region NS, a gate electrode 42 is formed on the semiconductor substrate 1 with a gate insulating film 41 sandwiched therebetween. On the side surfaces of the gate electrode 42, offset sidewalls 43a are formed and sidewalls 43b are formed outside the offset sidewalls 43a. N-type extension regions 44 are formed in parts of the semiconductor substrate 1 below the offset sidewalls 43a and the sidewalls 43b and P-type pocket regions 45 are formed below the N-type extension regions 44. Further, N-type source/drain regions 46 are formed in parts of the semiconductor substrate 1 outside the sidewalls 43b. A silicide layer 47 is formed on the gate electrode 42 and the N-type source/drain regions 46.

In the N-type SRAM region NS, a thin tensile stress applying insulating film 50a which is made of a silicon nitride film which applies tensile stress is formed by LP-CVD to cover the gate electrode 42, offset sidewalls 43a, sidewalls 43b and N-type source/drain regions 46. Further, a thin compressive stress applying insulating film 55a which is made of a silicon nitride film and applies compressive stress is formed by plasma CVD on the thin tensile stress applying insulating film 50a. The thin tensile stress applying insulating film 50a is thinner than the tensile stress applying insulating film 50 in the N-type logic region NL. The thin compressive stress applying insulating film 55a is thinner than the compressive stress applying insulating film 55 in the P-type logic region PL.

In the regions NL, PL, PS and NS, an interlayer insulating film 3 is formed to cover the tensile stress applying insulating film 50, compressive stress applying insulating film 55, thin tensile stress applying insulating film 50a and thin compressive stress applying insulating film 55a. Further, in the regions NL, PL, PS and NS, contact electrodes 4 are formed to penetrate the tensile stress applying insulating film 50, compressive stress applying insulating film 55, thin tensile stress applying insulating film 50a and thin compressive stress applying insulating film 55a to reach the silicide layers 17, 27, 37 and 47. In the P-type SRAM region PS, a shared contact electrode 5 is formed to contact the silicide layer 37 formed on the gate electrode 32, one of the offset sidewalls 33a, one of the sidewalls 33b and the silicide layer 37 formed on one of the P-type source/drain regions 36.

Now, a method for manufacturing the semiconductor device of the present embodiment will be explained with reference to FIGS. 2A to 7B. FIGS. 2A to 7B are sectional views illustrating the steps of manufacturing the semiconductor device of the first embodiment.

In the method of the present invention, first, in the step shown in FIG. 2A, gate insulating films 11, 21, 31 and 41 and gate electrodes 12, 22, 32 and 42 are formed on active regions made of a semiconductor substrate 1 in an N-type logic region NL, a P-type logic region PL, a P-type SRAM region PS and an N-type SRAM region NS which are isolated from each other by a shallow trench isolation region 2 formed in the semiconductor substrate 1. Then, offset sidewalls 13a, 23a, 33a and 43a are formed on the side surfaces of the gate electrodes 12, 22, 32 and 42.

Subsequently, in the N-type logic region NL and the N-type SRAM region NS, N-type impurities such as arsenic ions are implanted at acceleration energy of 3 KeV, a dose of $1.5 \times 10^{15}$ ion/cm$^2$ and a tilt angle of 0° to form N-type extension regions 14 and 44. Then, P-type impurities such as boron ions are implanted at acceleration energy of 10 KeV, a dose of $8.0 \times 10^{12}$ ion/cm$^2$ and a tilt angle of 25° from four directions by rotating the wafer to form P-type pocket regions 15 and 45. The P-type pocket regions 15 and 45 are formed to cover the bottom surfaces of the N-type extension regions 14 and 44, respectively.

Then, in the P-type logic region PL and the P-type SRAM region PS, P-type impurities such as boron ions are implanted at acceleration energy of 0.5 KeV, a dose of $3.0 \times 10^{14}$ ion/cm$^2$ and a tilt angle of 0° to form P-type extension regions 24 and 34. Then, N-type impurities such as phosphorus ions are implanted at acceleration energy of 30 KeV, a dose of $7.0 \times 10^{12}$ ion/cm$^2$ and a tilt angle of 25° from four directions by rotating the wafer to form N-type pocket regions 25 and 35. The N-type pocket regions 25 and 35 are formed to cover the bottom surfaces of the P-type extension regions 24 and 34, respectively.

Then, a silicon nitride film is formed over the entire surface of the substrate by LP-CVD. The silicon nitride film is then etched back to form sidewalls 13b, 23b, 33b and 43b covering the side surfaces of the gate electrodes 12, 22, 32 and 42. After that, in the N-type logic region NL and the N-type SRAM region NS, N-type impurities such as arsenic ions are implanted at acceleration energy of 20 KeV, a dose of $4.0 \times 10^{15}$ ion/cm$^2$ and a tilt angle of 0° and N-type impurities such as phosphorus ions are implanted at acceleration energy of 10 KeV, a dose of $1.0 \times 10^{15}$ ion/cm$^2$ and a tilt angle of 7°. Thus, N-type source/drain regions 16 and 46 are formed.

Subsequently, in the P-type logic region PL and the P-type SRAM region PS, P-type impurities such as boron ions are implanted at acceleration energy of 2 KeV, a dose of $4.0 \times 10^{15}$ ion/cm$^2$ and a tilt angle of 7° to form P-type source/drain regions 26 and 36.

Then, silicide layers 17, 27, 37 and 47 are formed selectively on the gate electrodes 12, 22, 32 and 42 and the source/drain regions 16, 26, 36 and 46 by a salicide technique.

In the step shown in FIG. 2B, a silicon nitride film is formed over the entire surface of the substrate by LP-CVD as a tensile stress applying insulating film 50 of 50 nm thick.

In the step shown in FIG. 3A, a first resist mask 51 having an opening 52 is formed on the substrate such that the N-type logic region NL, N-type SRAM region NS and P-type SRAM region PS are covered and the P-type logic region PL is exposed. Using the first mask 51 as an etch mask, the tensile stress applying insulating film 50 is removed by etching from the P-type logic region PL.

In the step shown in FIG. 3B, the first mask 51 is removed.

In the step shown in FIG. 4A, a second resist mask 53 having an opening 54 is formed on the substrate such that the N-type logic region NL and the P-type logic region PL are covered and the N-type SRAM region NS and the P-type SRAM region PS are exposed. Using the second mask 53 as an etch mask, the tensile stress applying insulating film 50 in the N-type SRAM region NS and the P-type SRAM region PS is etched by about 30 nm to obtain a thin tensile stress applying insulating film 50a which is thinned down to about 20 nm.

In the step shown in FIG. 4B, the second mask 53 is removed.

In the step shown in FIG. 5A, a silicon nitride film is formed over the entire surface of the substrate by plasma CVD as a compressive stress applying insulating film 55 of 50 nm thick.

In the step shown in FIG. 5B, a third resist mask 56 having an opening 57 is formed on the substrate such that the P-type logic region PL, P-type SRAM region PS and N-type SRAM region NS are covered and the N-type logic region NL is exposed. Using the third mask 56 as an etch mask, the compressive stress applying insulating film 55 is removed by etching from the N-type logic region NL.

Figure 6A:
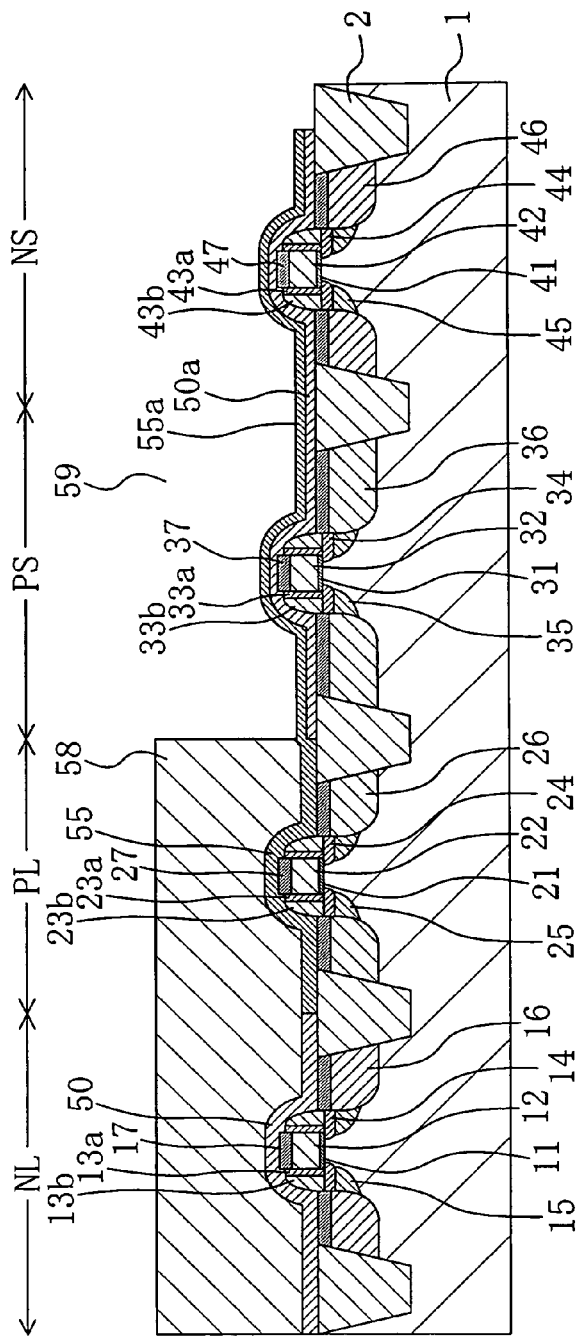
FIGS. 6A and 6B are sectional views illustrating the steps of manufacturing the semiconductor device of the first embodiment.

After the third mask 56 (shown in FIG. 5B) is removed in the step shown in FIG. 6A, a fourth resist mask 58 having an opening 59 is formed over the entire surface of the substrate such that the N-type logic region NL and the P-type logic region PL are covered and the P-type SRAM region PS and the N-type SRAM region NS are exposed. Using the fourth mask 58 as an etch mask, the compressive stress applying insulating film 55 in the N-type SRAM region NS and the P-type SRAM region PS is etched by about 30 nm to provide a thin compressive stress applying insulating film 55a which is thinned down to about 20 nm.

Figure 6B:
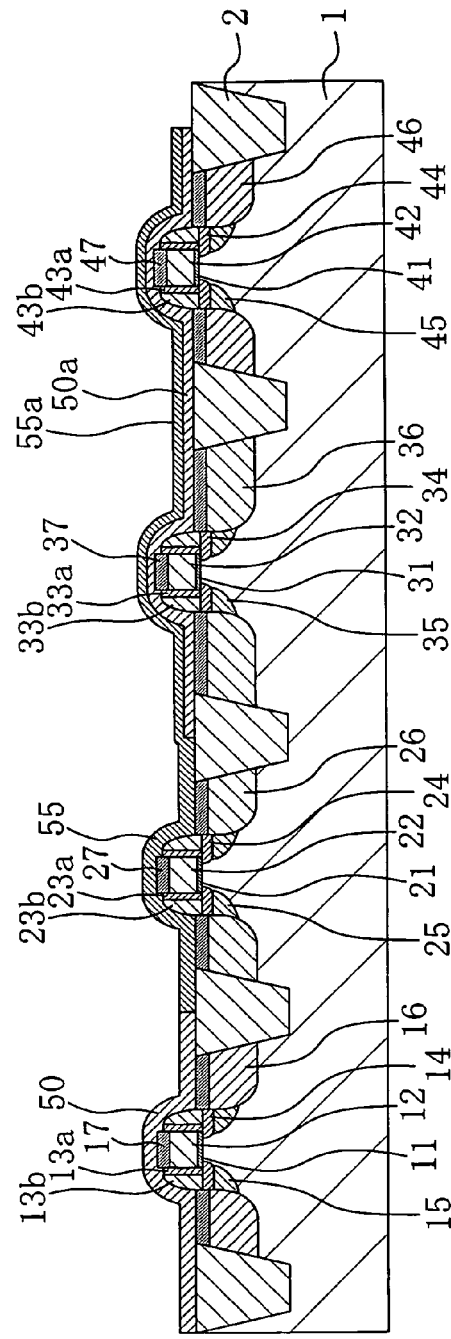

In the step shown in FIG. 6B, the fourth mask 58 is removed.

Figure 7A:
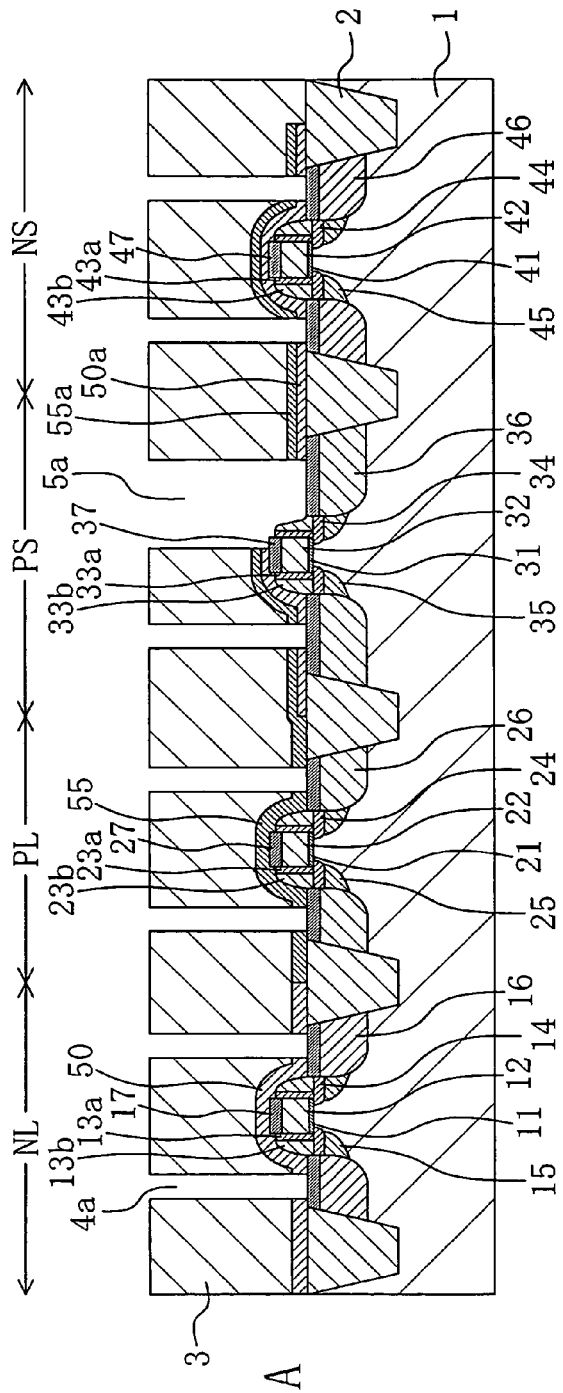
FIGS. 7A and 7B are sectional views illustrating the steps of manufacturing the semiconductor device of the first embodiment.

In the step shown in FIG. 7A, an interlayer insulating film 3 is formed over the entire surface of the substrate. Then, the interlayer insulating film 3, tensile stress applying insulating film 50, thin tensile stress applying insulating film 50a, compressive stress applying insulating film 55 and thin compressive stress applying insulating film 55a are subjected to lithography and etching to form contact holes 4a and a shared contact hole 5a reaching the silicide layers 17, 27, 37 and 47.

Figure 7B:
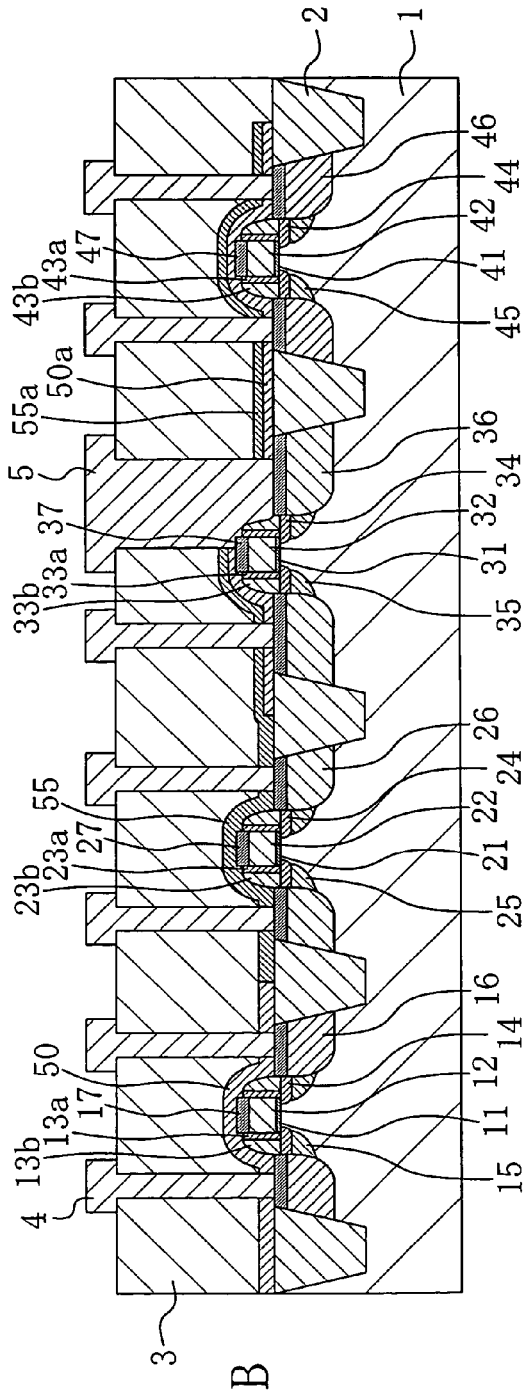

In the step shown in FIG. 7B, buried contact electrodes 4 and a shared contact electrode 5 are formed in the contact holes 4a and the shared contact hole 5a. The buried contact electrodes 4 and the shared contact electrode 5 are made of a combination of a barrier film made of TiN and a metal film made of tungsten, for example. Through the above-described steps, the semiconductor device of the present embodiment is fabricated.

In the semiconductor device of the present embodiment, the gate electrode 12 and the N-type source/drain regions (active regions) 16 in the N-type logic region NL are covered with the tensile stress applying insulating film 50. This structure improves the performance (drive capability) of the N-channel logic MIS transistors in the N-type logic region NL. In the P-type logic region PL, the gate electrode 22 and the P-type source/drain regions (active regions) 26 are covered with the compressive stress applying insulating film 55. This structure improves the performance (drive capability) of the P-channel logic MIS transistors in the P-type logic region PL.

The gate electrode 32 and the P-type source/drain regions (active regions) 36 in the P-type SRAM region PS and the gate electrode 42 and the N-type source/drain regions (active regions) 46 in the N-type SRAM region NS are covered with a layered film including the thin tensile stress applying insulating film 50a and the thin compressive stress applying insulating film 55a. In this case, tensile stress applied by the thin tensile stress applying insulating film 50a and compressive stress applied by the thin compressive stress applying insulating film 55a cancel each other. Therefore, the active regions in the P-type SRAM region PS and the N-type SRAM region NS are applied with less stress as compared with the case where the active regions are covered with one of the insulating films. As a result, the performance of N-channel SRAM MIS transistors in the N-type SRAM region NS and that of P-channel SRAM MIS transistors in the P-type SRAM region PS become almost equal. Thus, the MIS transistors in both of the SRAM regions are kept in balance as compared with the case where the MIS transistors are covered with stress applying films of the same kind.

Further, as the thin tensile stress applying insulating film 50a and the thin compressive stress applying insulating film 55a are made thinner than the tensile stress applying insulating film 50 in the N-type logic region NL and the compressive stress applying insulating film 55 in the P-type logic region PL, stress applied to the substrate is adjusted to a certain degree suitable for the transistors in the SRAM.

According to the method for manufacturing the semiconductor device of the present embodiment, in the step shown in FIG. 7A, the shared contact hole 5a is formed after the sidewalls 33b are covered with the thin tensile stress applying insulating film 50a and the thin compressive stress applying insulating film 55a. Therefore, as compared with the prior art method in which these films are not formed, the sidewalls 33b are prevented from being etched back and the occurrence of leakage between the gate electrode 32 and the P-type source/drain regions 36 is prevented.

Figure 14:
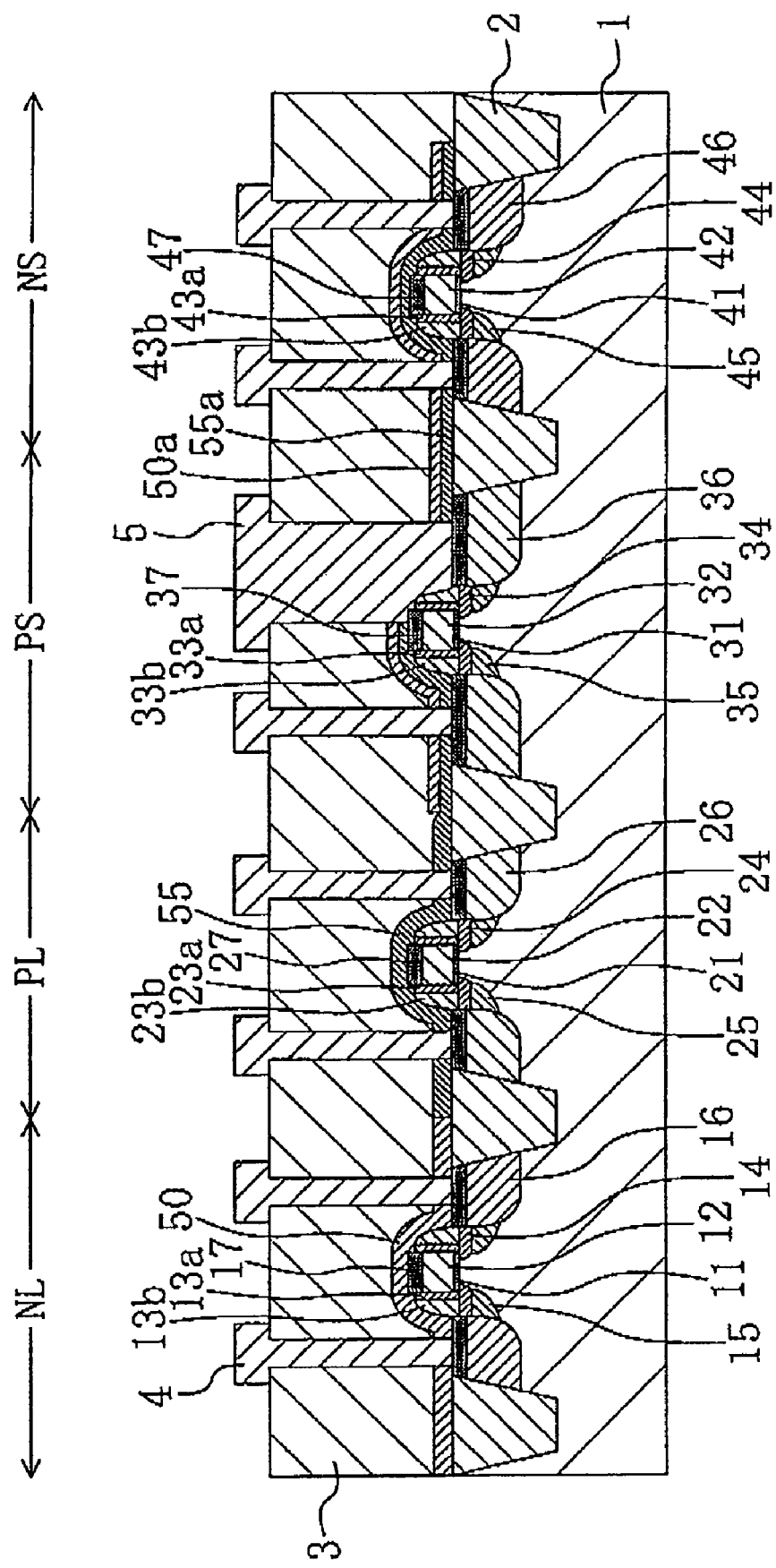
FIG. 14 is a sectional view illustrating the structure of a semiconductor device according to a modified embodiment.

In the present embodiment, the thin compressive stress applying insulating film 55a is formed on the thin tensile stress applying insulating film 50a in the P-type SRAM region PS and the N-type SRAM region NS. However, these insulating films may be stacked in a reverse order (see, FIG. 14).

In the present embodiment, the explanation is provided for the formation of the SRAM region. In general, the transistors for the SRAM are required to show uniform performance, the present invention is effectively applied thereto. However, the present invention is not limited to the SRAM. Specifically, if the above-described layered film is formed over the P-type and N-type MIS transistors which are formed on a single substrate, the performances of the transistors are kept in balance. In particular when the P-type MIS transistors and the N-type MIS transistors are arranged close to each other, it is difficult to cover the transistors with different films. Therefore, the method of the present invention is effectively applied thereto.

Second Embodiment

Figure 8:
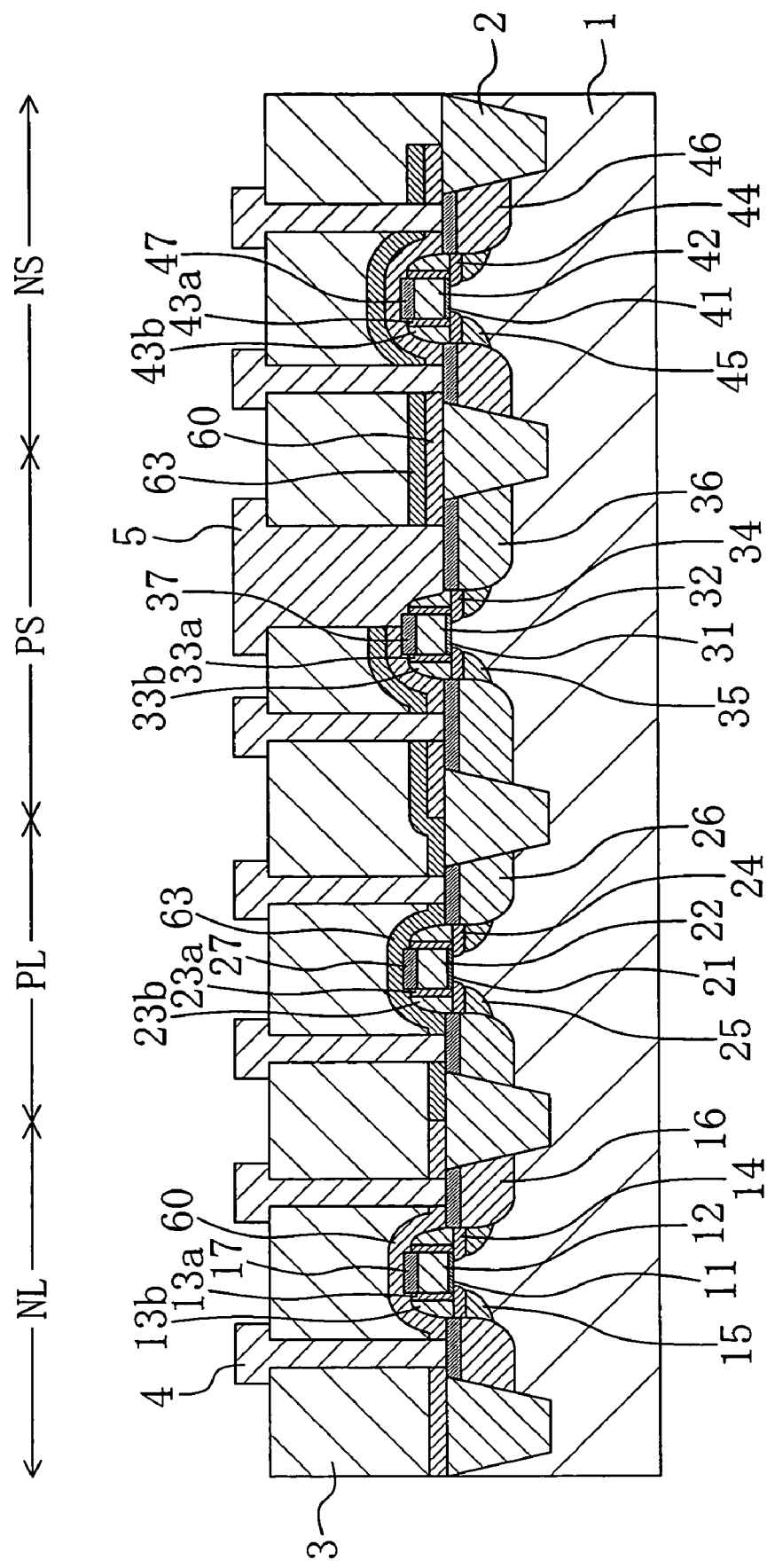
FIG. 8 is a sectional view illustrating the structure of a semiconductor device according to a second embodiment of the present invention.

FIG. 8 is a sectional view illustrating the structure of a semiconductor device of the second embodiment of the present invention. As shown in FIG. 8, in the semiconductor device of the present embodiment, a tensile stress applying insulating film 60 in the N-type SRAM region NS and the P-type SRAM region PS has substantially the same thickness as that of a tensile stress applying insulating film 60 in the N-type logic region NL. Likewise, a compressive stress applying insulating film 63 in the N-type SRAM region NS and the P-type SRAM region PS has substantially the same thickness as that of a compressive stress applying insulating film 63 in the P-type logic region PL. A detailed explanation of the second embodiment is omitted because the second embodiment is the same as the first embodiment except for this feature. The term "substantially the same thickness" signifies that ignorable variations in film thickness caused under the same condition are permitted.

FIGS. 9A to 12B are sectional views illustrating the steps of manufacturing the semiconductor device of the second embodiment. According to the method of the present embodiment, in the step shown in FIG. 9A, gate electrodes 12, 22, 32 and 42 are formed in the same manner as described in the first embodiment. Then, a silicon nitride film is formed over the entire surface of the substrate by LP-CVD as a tensile stress applying insulating film 60 of 30 nm thick.

Figure 9A:
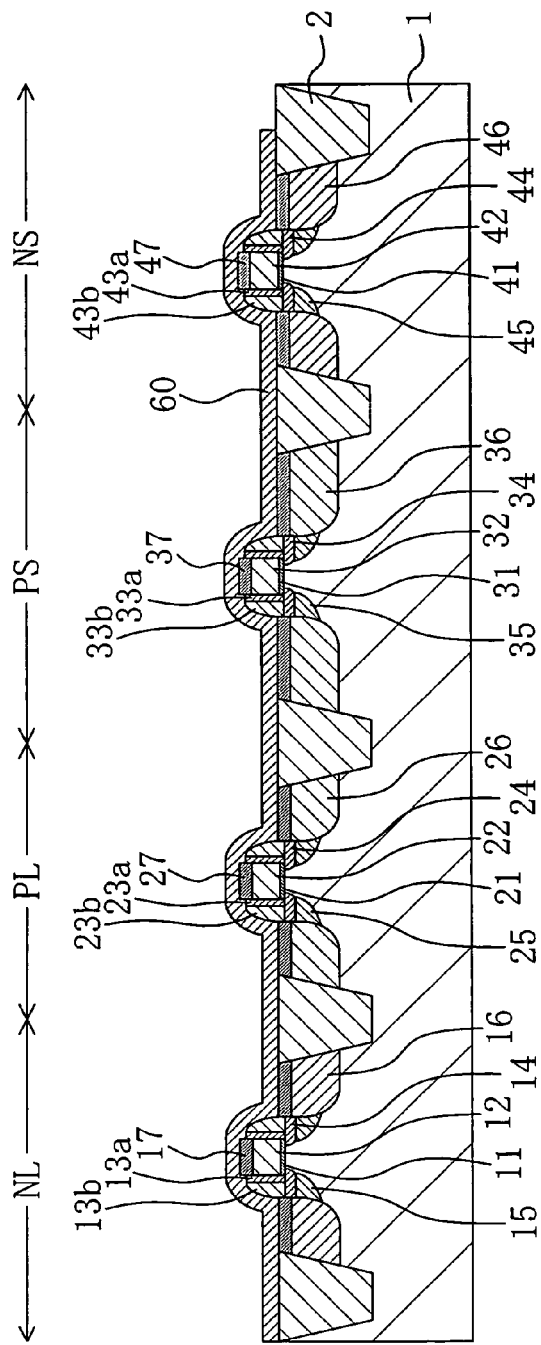
FIGS. 9A and 9B are sectional views illustrating the steps of manufacturing the semiconductor device of the second embodiment.
Figure 9B:
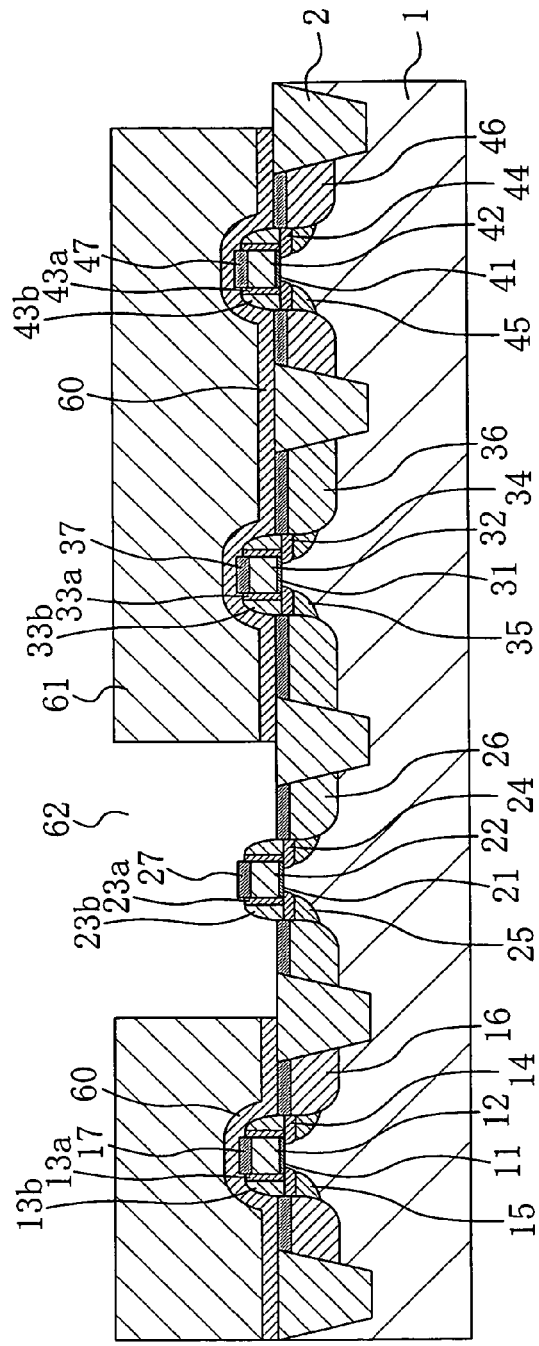

In the step shown in FIG. 9B, a first resist mask 61 having an opening 62 is formed on the substrate to cover the N-type logic region NL, N-type SRAM region NS and P-type SRAM region PS and expose the P-type logic region PL. Using the first mask 61 as an etch mask, the tensile stress applying insulating film 60 is removed by etching from the P-type logic region PL.

In the step shown in FIG. 10A, the first mask 61 is removed.

In the step shown in FIG. 10B, a silicon nitride film is formed over the entire surface of the substrate by plasma CVD as a compressive stress applying insulating film 63 of 30 nm thick.

In the step shown in FIG. 11A, a second resist mask 64 having an opening 65 is formed on the substrate to cover the P-type logic region PL, P-type SRAM region PS and N-type SRAM region NS and expose the N-type logic region NL. Using the second mask 64 as an etch mask, the compressive stress applying insulating film 63 is removed by etching from the N-type logic region NL.

In the step shown in FIG. 11B, the second mask 64 is removed.

Figure 12A:
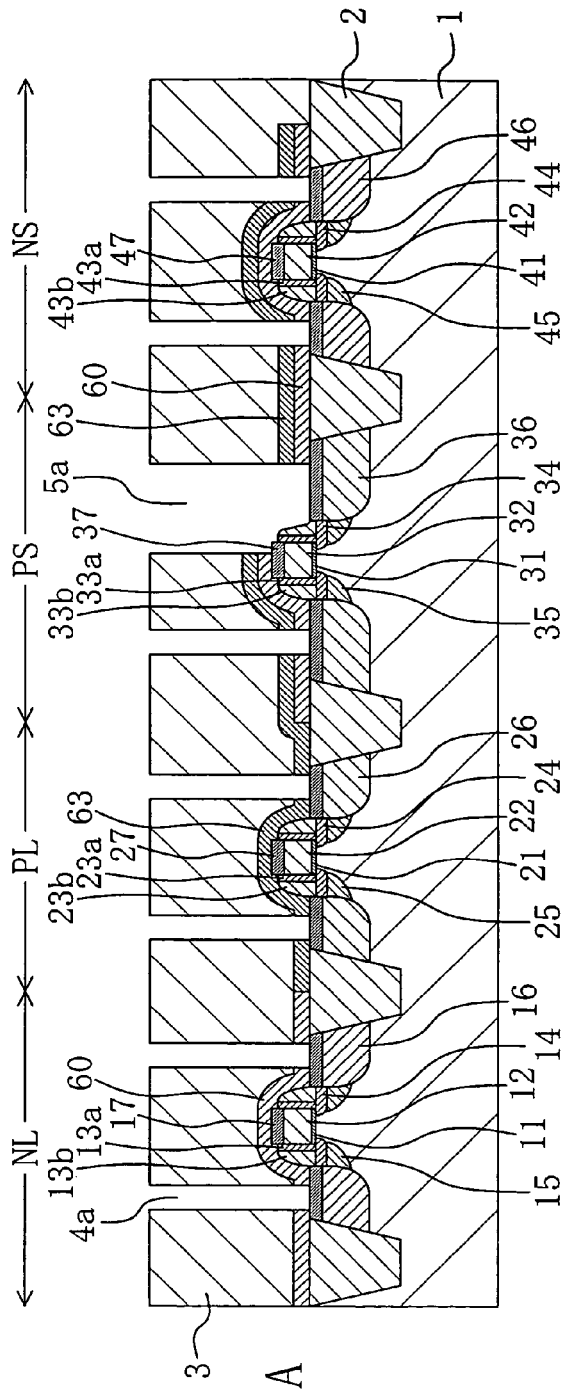
FIGS. 12A and 12B are sectional views illustrating the steps of manufacturing the semiconductor device of the second embodiment.

In the step shown in FIG. 12A, an interlayer insulating film 3 is formed on the entire surface of the substrate. Then, the interlayer insulating film 3, tensile stress applying insulating film 60 and compressive stress applying insulating film 63 are subjected to lithography and etching to form contact holes 4a and a shared contact hole 5a reaching the silicide layers 17, 27, 37 and 47.

Figure 12B:
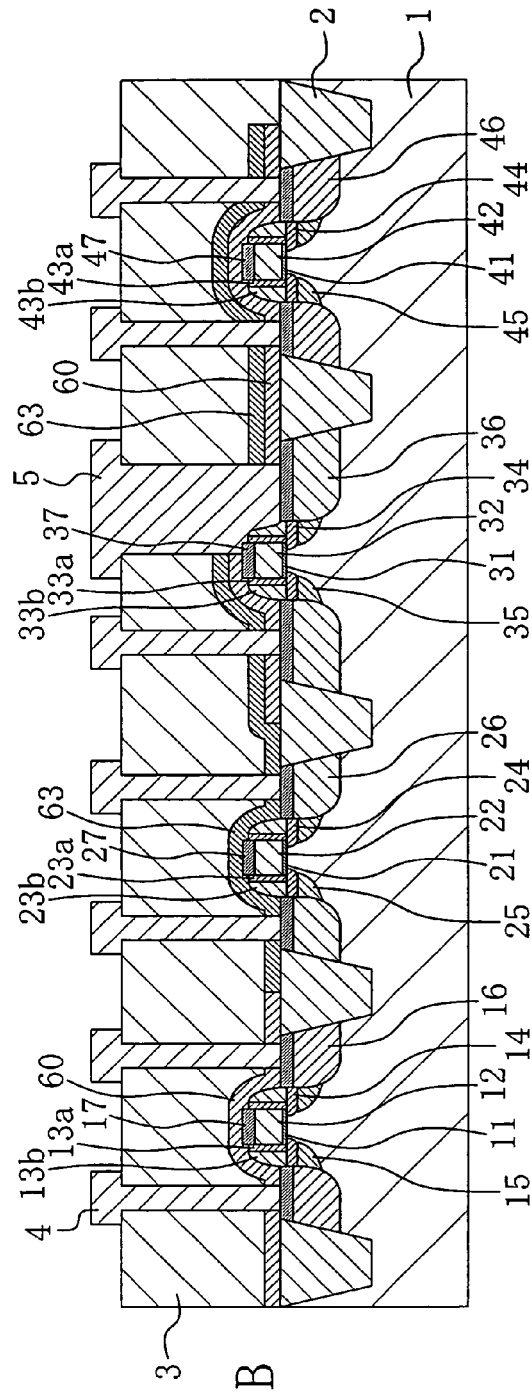
Figure 13:
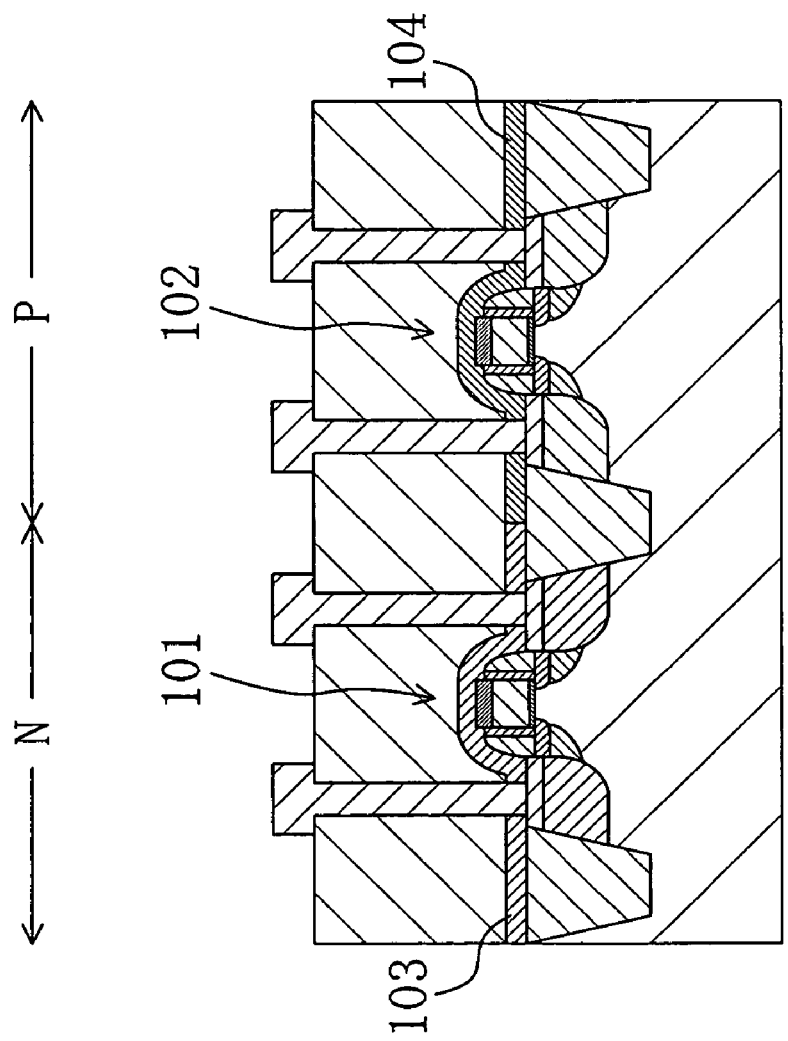
FIG. 13 is a sectional view illustrating the structure of a conventional transistor.

In the step shown in FIG. 12B, buried contact electrodes 4 and a shared contact electrode 5 are formed in the contact holes 4a and the shared contact hole 5. Through these steps, the semiconductor device of the present embodiment is fabricated.

In the semiconductor device of the present embodiment, the gate electrode 12 and the N-type source/drain regions (active regions) 16 in the N-type logic region NL are covered with the tensile stress applying insulating film 60. This structure improves the performance (drive capability) of the N-channel logic MIS transistors in the N-type logic region NL. In the P-type logic region PL, the gate electrode 22 and the P-type source/drain regions (active regions) 26 are covered with the compressive stress applying insulating film 63. This structure improves the performance (drive capability) of the P-channel logic MIS transistors in the P-type logic region PL.

The gate electrode 32 and the P-type source/drain regions (active regions) 36 in the P-type SRAM region PS and the gate electrode 42 and the N-type source/drain regions (active regions) 46 in the N-type SRAM region NS are covered with a layered film including the tensile stress applying insulating film 60 and the compressive stress applying insulating film 63. In this case, tensile stress applied by the tensile stress applying insulating film 60 and compressive stress applied by the compressive stress applying insulating film 63 cancel each other. Therefore, the active regions in the P-type SRAM region PS and the N-type SRAM regions NS are applied with less stress as compared with the case where the active regions are covered with one of the insulating films. As a result, the performance of N-channel SRAM MIS transistors in the N-type SRAM region NS and that of P-channel SRAM MIS transistors in the P-type SRAM region PS become equivalent.

Thus, the MIS transistors in both of the SRAM regions are kept in balance as compared with the case where the MIS transistors are covered with stress applying films of the same kind.

According to the method for manufacturing the semiconductor device of the present embodiment, in the step shown in FIG. 12A, the shared contact hole 5a is formed after the sidewalls 33b are covered with the tensile stress applying insulating film 60 and the compressive stress applying insulating film 63. Therefore, as compared with the prior art method in which these films are not formed, the sidewalls 33b are prevented from being etched back and the occurrence of leakage between the gate electrode 32 and the P-type source/drain regions 36 is prevented.

In the present embodiment, the compressive stress applying insulating film 63 is formed on the tensile stress applying insulating film 60 in the P-type SRAM region PS and the N-type SRAM region NS. However, these insulating films may be stacked in a reverse order. The above-described effect is achieved also in this case.

What is claimed is:

1. A semiconductor device comprising:
a first MIS transistor of N-channel type including a first gate electrode which is formed above a first active region made of a semiconductor layer and first source/drain regions which are formed in parts of the first active region located at sides of the first gate electrode;
a second MIS transistor of P-channel type including a second gate electrode which is formed above a second active region made of the semiconductor layer and second source/drain regions which are formed in parts of the second active region located at sides of the second gate electrode;
a layered film which covers the first gate electrode, the first active region, the second gate electrode and the second active region and includes a first insulating film which applies tensile stress and a second insulating film which applies compressive stress;
an interlayer insulating film which is formed on the layered film;
a third MIS transistor of N-channel type including a third gate electrode which is formed above a third active region made of the semiconductor layer and third source/drain regions which are formed in parts of the third active region located at sides of the third gate electrode; and
a third insulating film which covers the third gate electrode and the third active region and applies tensile stress, wherein
both of the first insulating film and the second insulating film of the layered film are formed over an upper surface of the first gate electrode and an upper surface of the second gate electrode, and
the second insulating film is not formed above the third active region.

2. The semiconductor device of claim 1, wherein the first MIS transistor and the second MIS transistor are included in a static random access memory.

3. The semiconductor device of claim 1, wherein the first insulating film is thinner than the third insulating film.

4. The semiconductor device of claim 1, wherein the third MIS transistor is formed in a logic region.

5. The semiconductor device of claim 1, wherein
sidewalls are formed on side surfaces of the first gate electrode,
the layered film covers the first source/drain regions, the sidewalls and the first gate electrode and
a shared contact is formed to penetrate the interlayer insulating film and the layered film to reach the first source/drain regions, the sidewalls and the first gate electrode.

6. The semiconductor device of claim 1 further comprising:
a fourth MIS transistor of P-channel type including a fourth gate electrode which is formed above a fourth active region made of the semiconductor layer and fourth source/drain regions which are formed in parts of the fourth active region located at sides of the fourth gate electrode; and
a fourth insulating film which covers the fourth gate electrode and the fourth active region and applies compressive stress, wherein
the first insulating film is not formed above the fourth active region.

7. The semiconductor device of claim 6, wherein the second insulating film is thinner than the fourth insulating film.

8. The semiconductor device of claim 6, wherein the fourth MIS transistor is formed in a logic region.

9. The semiconductor device of claim 1, wherein
sidewalls are formed on side surfaces of the second gate electrode,
the layered film covers the second source/drain regions, the sidewalls and the second gate electrode and
a shared contact is formed to penetrate the interlayer insulating film and the layered film to reach the second source/drain regions, the sidewalls and the second gate electrode.

10. The semiconductor device of claim 1, wherein the second insulating film is in contact with an upper surface of the first insulating film.

11. The semiconductor device of claim 1, wherein the first insulating film is in contact with an upper surface of the second insulating film.

12. A semiconductor device comprising:
a first MIS transistor of N-channel type including a first gate electrode which is formed above a first active region made of a semiconductor layer and first source/drain regions which are formed in parts of the first active region located at sides of the first gate electrode;
a second MIS transistor of P-channel type including a second gate electrode which is formed above a second active region made of the semiconductor layer and second source/drain regions which are formed in parts of the second active region located at sides of the second gate electrode;
a layered film which covers the first gate electrode, the first active region, the second gate electrode and the second active region and includes a first insulating film which applies tensile stress and a second insulating film which applies compressive stress;
an interlayer insulating film which is formed on the layered film;
a third MIS transistor of P-channel type including a third gate electrode which is formed above a third active region made of the semiconductor layer, and third source/drain regions which are formed in parts of the third active region located at sides of the third gate electrode; and
a third insulating film which covers the third gate electrode and the third active region and applies compressive stress, wherein
both of the first insulating film and the second insulating film of the layered film are formed over an upper surface of the first gate electrode and an upper surface of the second gate electrode, and
the first insulating film is not formed above the third active region.

* * * * *